United States Patent [19]

Nicotra

[11] Patent Number: 4,769,620

[45] Date of Patent: Sep. 6, 1988

[54] MICROWAVE OSCILLATOR WITH DIELECTRIC RESONATOR

[75] Inventor: Sebastiano Nicotra, Paderno D'Adda, Italy

[73] Assignee: Mizar S.p.A., Italy

[21] Appl. No.: 53,326

[22] Filed: May 22, 1987

[30] Foreign Application Priority Data

May 30, 1986 [IT] Italy .............................. 22037/86[U]

[51] Int. Cl.$^4$ .............................................. H03B 5/18
[52] U.S. Cl. .............................. 331/96; 331/107 DP; 331/117 D; 333/235
[58] Field of Search .............. 331/96, 107 DP, 117 D, 331/177 R; 333/235, 247, 250

[56] References Cited

U.S. PATENT DOCUMENTS

| | | | |
|---|---|---|---|
| 4,079,341 | 3/1978 | Linn et al. | 331/117 D X |
| 4,325,035 | 4/1982 | Nishikawa et al. | 331/117 D X |
| 4,521,746 | 6/1985 | Hwan et al. | 331/117 D X |
| 4,588,964 | 5/1986 | Hirai et al. | 331/96 X |
| 4,639,690 | 1/1987 | Lewis | 331/117 D X |

Primary Examiner—Eugene R. Laroche
Assistant Examiner—David Mis
Attorney, Agent, or Firm—Ostrolenk, Faber, Gerb & Soffen

[57] ABSTRACT

The oscillator according to the invention consists at least of: a body which has a determined geometric structure and is closed by an upper cover with a first tuning screw inserted therethrough and by a lower cover having inserted therethrough an output connector, a feed filter and preferably a second tuning screw; a resonator which is geometrically homogeneous with the said body structure and is arranged on the inner wall of the lower cover through a spacer; a microstrip also on the lower cover, arranged sideways but coupled with the resonator; a bipolar transistor or a field effect transistor; substrates preferably of fluorine polymers reinforced with fiber-glass; capacitor elements on radio-frequency block and on output by-pass; and resistances to bias, and feed the transistor and to terminate the microstrip.

3 Claims, 2 Drawing Sheets

MICROWAVE OSCILLATOR WITH DIELECTRIC RESONATOR

BACKGROUND OF THE INVENTION

The present invention concerns a microwave oscillator comprising at least a dielectric resonator, a metallic container for said resonator, at least one tuning screw, a transistor, a feeding filter and output connectors.

PRIOR ART

Microwave oscillators of the above type are known, in which the dielectric resonator is inserted in a container and is coupled to a micro-strip placed on a non-metallic substrate.

The resonator body (generally cylindrical but possibly also toroidal, prismatic, cake-like etc.) defines with its diameter and height, the resonant frequency generally of the TE011 mode in order to have a high Q. Normally it is formed of barium titanate (preferably of Ba-tetratitanate) and for very high frequencies, for instance of 20 gHz, is formed of aluminium oxide.

As an active element, even if ordinary, normally bipolar transistors can be utilized up to certain frequencies, e.g. up to about 4 gHz; field effect transistors (FET or even better MOSFET) are prefered for higher frequencies. The transistor or transistors, e.g. the FET are mounted on a micro-strip disposed on a support or substrate, e.g. of alumina, "teflon-fiberglass", "duroid", quartz, sapphire and the like.

Generally the (cylindrical or non-cylindrical) resonator is inserted in a container having a box or case shape, in which also the micro-strip carrying dielectric substrate is mounted. The box-shaped container has the disadvantage of causing distortion on the electro-magnetic fields which escape from the resonator by closing itself on an assymetrical way because of the geometric dishomogeneity over the resonator.

Moreover the size reductions of the parallelpiped case are restricted by the fact that resonant modes typical of said case and not of the dielectric resonator must not be generated. Should it be desired to eliminate this impact of the case shaped container on the resonance modes of the dielectric resonator, it would then be necessary to greatly reduce the case dimensions, more particularly to keep them below the dimensions to which the first resonance mode (even if different from the one of the resonator) corresponds.

It is nevertheless true that the dimensions of the box could be higher than those above-stated, however in such a case the device tunability would be severely restricted.

SUMMARY OF THE INVENTION

It is an object of the present invention to eliminate the above disadvantage and to provide an oscillator whose resonator is a container having such a geometry is not subject to the above-mentioned restrictions.

It has indeed been found that the phenomena of distortion on the electromagnetic fields going outside the dielectric resonator are eliminated by adopting containers of geometry homogeneous with that of the resonator since with this homogeneous geometry it is possible to avoid the prior disadvantage of the case-shaped containers is the sense that while these last containers to give no distortions, they must have dimensions lower than a minimally acceptable size and moreover even if with dimensions lower than the minimally acceptable size, they generate holes or discontinuities in the tuning band. Now on the contrary it is possible to use geometrically homogeneous containers which do not create neither distorsions nor holes even if they have optimal dimension from the point of view of maneuverability. This is extremely important because with the elimination of the drastic restrictions in the dimension of the geometrically homogeneous container it is now possible to put a higher number of components on the substrate of the micro-strip to be inserted in the container and thus to increase the circuit functions, while maintaining a high maneuverability (access, substitution, extraction etc) on the support.

As the resonator is preferably cylindrical, the relevant geometrically homogeneous container will also be cylindrical (even if the invention is not limited to such a simpler and more immediate shape). Besides the already mentioned advantages related to the absence of distortions and to the higher maneuverability, further benefits are obtained, which benefits involve the manufacture and working techniques. For instance, if the container is of a metal with a low coefficient of thermal expansion (e.g. "INVAR" or "SUPER-INVAR"), switching from the case geometry to that homogeneous with the resonator, e.g. the cylindrical shape, it has surprisingly been found that the use of precious metal (INVAR) can be limited to a portion of the container body, particularly to the tubular wall, while the relevant covers can be made of less expensive materials. Further, there is a high flexibility in the sizing, e.g. the container can now have diameters up to 5 times higher; the height of the resonator container can now be 4 times higher. Even if with these higher dimensions which provide an excellent maneuverability, in no case are there distortions. Moreover, at increasing resonance frequencies, it is simply possible to increase the ratio container diameter to resonator diameter (obviously within limits).

By making dielectric resonator spacer in tubular shape, it is moreover possible to insert a second tuning screw inside said spacer.

The two tuning screws act independently from one another without any reciprocal influence. They can thus be used for different purposes, e.g., to make a coarse tuning and a fine tuning, or to obtain a precise compensation vs temperature of the frequency of the oscillator by tuning it independently.

BRIEF DESCRIPTION OF THE DRAWINGS

The above-mentioned and other features and advantages of the invention will become more apparent by reference to the following description of the (preferred but not limiting) embodiment shown in the accompanying drawing in which.

DESCRIPTION OF THE PREFERRED EMBODIMENT

Figure 1:
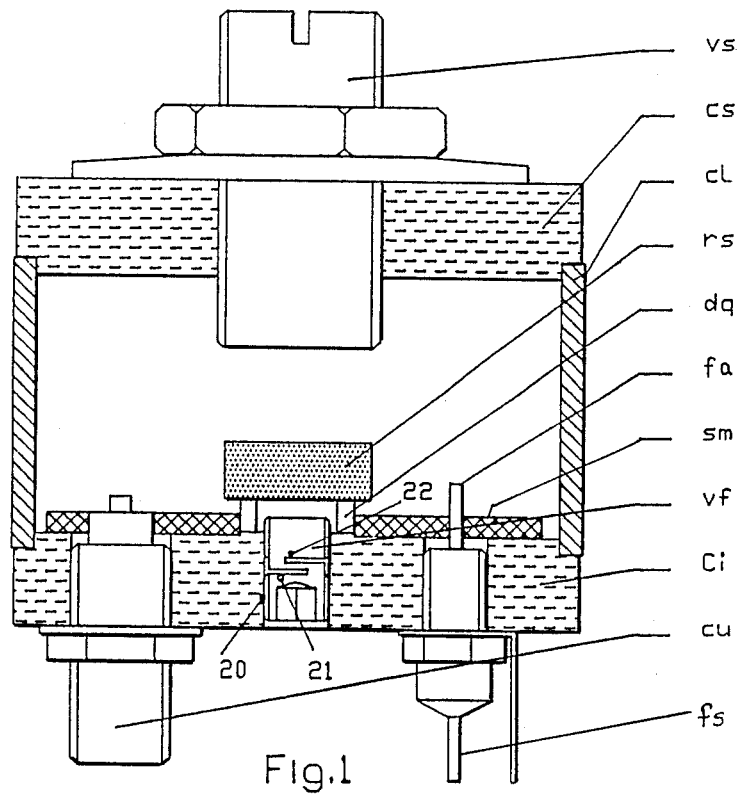
FIG. 1 is a schematic view partially in a longitudinal cross-section of an oscillator according to the invention.
Figure 2:
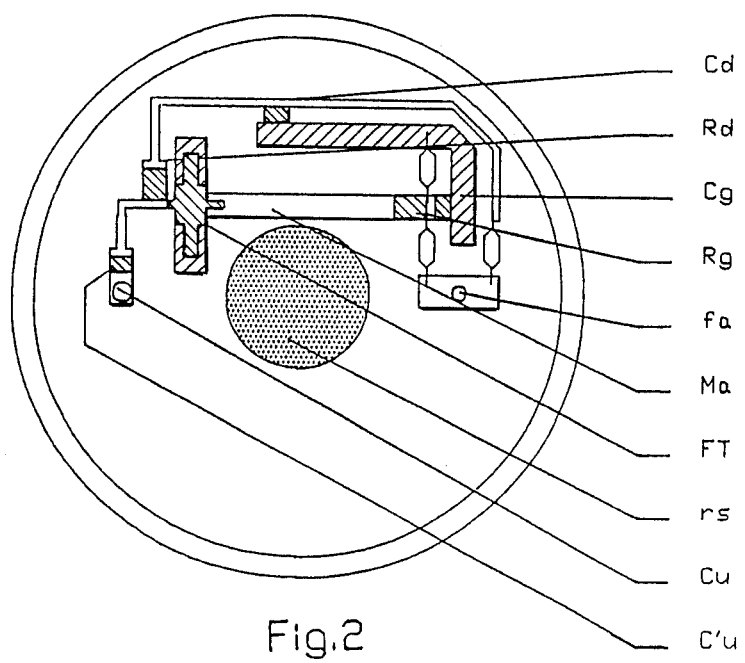
FIG. 2 is a top view of the oscillator of FIG. 1.

As it can be seen from FIGS. 1 and 2, the container according to the invention consists of the cylindrical body "cl" which is closed on its top by the upper cover "cs" and on its bottom by the lower cover "ci".

Preferably the cylinder is of low thermal coefficient material (e.g. "INVAR").

Figure 3:
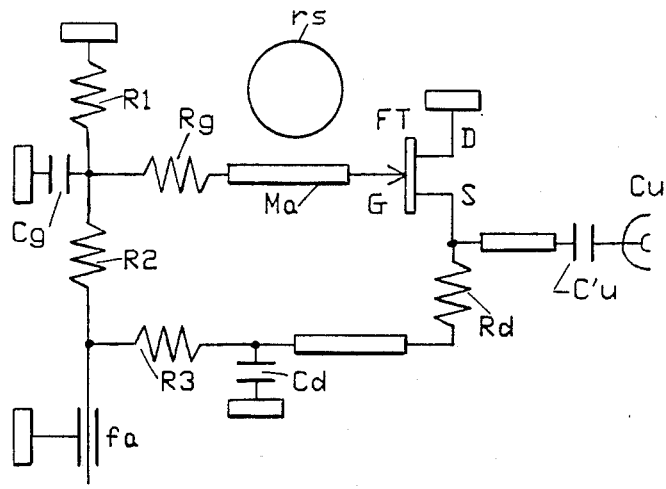
FIG. 3 is the corresponding equivalent electric scheme.

The tuning screw for the frequency regulation is "vs", and "vf" indicates a second tuning screw. According to a feature of the invention, the dielectric resonator "rs" has the same geometrical structure of the oscillator body "cl" and its free upper face faces towards the inner end of screw "vs", whereas its internal face is substantially adjacent to a dielectric spacer "dq" which preferably and for a major easiness is geometrically homogeneous with the resonator "rs" and with the oscillator body "cl". "Sm" indicates the dielectric support or substrate of the microstrip Ma which is coupled with the dielectric resonator "rs" (see FIG. 2). Cu is the output connector and "fs" indicates the feed filter. In the FIGS. 2 and 3 C'u indicates the output by-pass capacitor, FT is a transistor preferably a field effect transistor (FET or MESFET), Rd and Rg designate the resistances for the feeding of the source S, respectively the resistance of termination of the microstrip "Ma", Cd and Cg are the two capacities for stopping the radiofrequencies, "fa" is the strip to solder the feeding filter "fs", and R1,R2 and R3 the polarisation resistances.

Three configurations have been tested which make use of the cavity or resonator "rs": I) in reflection on the gate G; or II) or in shunt on the source S or in transmission on the examined substrates.

Configuration I

The major performances have been obtained with the first configuration by putting the resonator "rs" in reflection on the gate G.

The gate line or microstrip "Ma" is terminated on 50 Ohm to avoid spurious oscillations.

The power is taken from source S on the microstrip through a microstrip impedance transformer (not shown) which raises the impedance.

The power so furnished remains constant on a band for about 3% and is of 5–6 dB lower than the maximum power of the FET, FT. The observed pulling was minimum.

In configuration I, resonator position is not critical and no circuit modifications are needed when dielectrics are interchanged which are resonant at different frequencies (within a band of 15%). Because of the residual effect of the gate termination the oscillator noise is remarkably low (even if it is not to be considered as the minimum obtainable).

Configuration II

By placing the resonator in shunt on the source a slightly lower noise is obtained.

The second harmonic is of about 5 dB lower than in the configuration I, but in this second configuration II, to less than 1%.

The resonator position is thus very critical in configuration II.

The oscillator load must be carefully matched as it influences the resonator coupling. The gate reactance must be regulated with attention and is obtained by grounding immediately the gate by means of a (over-resonance) capacitor avoiding thus distributed elements which generate spurious oscillations and which could be coupled with the resonator. The output power is equal to that of the preceding case.

Configuration III

By placing the resonator in transmission, unsatisfactory results have been obtained under any point of view.

The source line has been terminated on 50 Ohm, the resonator is set nearby and is coupled on the opposite side with the load through an open line.

The load coupling line is coupled also with the field inside the container and does not allow easy regulations for the performance optimization.

For all three of the above configurations, fluorine polymers ("Teflon") reinforced with fiber glass have been utilized for the substrate. For thicknesses of about 0.8 mm the "Teflon" substrate does not require a high precision at the photo exposure and allows the easy realisation of circuit elements like DC blocs, bias chokes, radial resonators however the width of the track is not negligible over the dielectric resonator diameter and irradiates so much inside the metallic container that serious difficulties are encountered in the oscillator tuning.

With teflon-fiberglass having a thickness of 0.5 mm have been obtained results better than with a thickness of 0.8 without requesting a substantially higher incision (engraving) precision, the circuit elements, are obtained with concentrated capacities (auto-resonant porcelain capacitors). It is easy to terminate a line with thick film resistances as these last have the same track width. As anticipated the resonator is to be kept raised by means of a dielectric spacer "dq" from the substrate "sm". The best results have been obtained with a spacer of 2 mm on the substrate of 0.5 mm and with a spacer of 1.5-2 mm on the substrate of 0.8 mm.

It is advantageous that the position varies from a position tangent to the track to a position at a distance of some milimeters (as in FIG. 2).

By operating in this way a good coupling of the TE011 mode is obtained with spurious modes taking place only at 20–30% higher frequencies; the coupling at TM modes is negligible.

In an advantageous embodiment a FET with a gate length of 1 micron and a maximum output power of +23 dB has been used and following performances have been noted.

Tunability: 5600:5800 MHz
Output power: 18:17 dBm
Pulling with 20 dB reflected power: 100 KHz, 0.3 dB
Second harmonic: 20–25 dB below the fundamental.
Noise (total): below 85 dB carrier/Hz at 10 KHz
Feed: 12 V, 100 mA
Temperature stability of the frequency: ±0.5 ppm/°C. in the range of from. 30° C.: ±80° C.
Temperature stability of the power: about ±0.3 dB in the range of from. "0° C. to +80° C.

Preferably the second tuning screw "vf" is of an elastic alloy, e.g. Cu-Be and its outer threaded surface 20 shows two innerly projecting cuts 21 and 22 to have a spring behaviour which allows an insertion in the lower cover Ci without the need of a screw driver.

It has been found that very good performances are obtained by adopting a container diameter from 3 to 5 times the diameter of the resonator.

An other advantage of the oscillator according to the invention, particularly in its first above mentioned configuration (resonator in reflection on the gate) is that it can provide a high (radio frequency) power on the harmonics of the fundamental TE011 resonance frequency as determined by the resonator itself. The performances are substantially equal to the performances obtained with the fundamental oscillation.

For example, the power obtained on the second harmonic, after filtering, is about 3 dB lower than the power of the fundamental frequency.

What is claimed is:

1. A microwave oscillator comprising at least: a dielectric resonator operating in the TE011 mode, a container body for containing the resonator comprising a tubular wall and upper and lower covers, a tubular spacer for spacing said resonator from the inside of said container, a transistor, first and second tuning screws, a feed filter and output connectors, characterized in that said container body and said resonator have a cylindrical geometry with circular cross-section, the diameter of the container being from 3 to 5 times the diameter of the resonator, the first tuning screw extending through the upper cover and the second tuning screw extending through the lower cover and within the tubular spacer and being operated independently from said first tuning screw.

2. An oscillator according to claim 1, wherein said tubular wall is made of precious material, and said upper and lower covers are made of less precious material.

3. An oscillator according to claim 1, wherein the height of the container is about 4 times the height of the resonator.

* * * * *